United States Patent
Keshtbod et al.

(10) Patent No.: US 8,830,737 B2
(45) Date of Patent: Sep. 9, 2014

(54) METHOD AND APPARATUS FOR SENSING THE STATE OF A MAGNETIC TUNNEL JUNCTION (MTJ)

(71) Applicant: Avalanche Technology, Inc., Fremont, CA (US)

(72) Inventors: Parviz Keshtbod, Los Altos Hills, CA (US); Ebrahim Abedifard, Sunnyvale, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/716,922

(22) Filed: Dec. 17, 2012

(65) Prior Publication Data

US 2014/0169079 A1 Jun. 19, 2014

(51) Int. Cl.
*G11C 11/00* (2006.01)
*G11C 11/16* (2006.01)

(52) U.S. Cl.
CPC .................................... *G11C 11/16* (2013.01)
USPC ............................................ 365/158; 365/171

(58) Field of Classification Search
USPC ............................................ 365/158, 171, 173
See application file for complete search history.

(56) References Cited

U.S. PATENT DOCUMENTS

2012/0008380 A1*  1/2012  El Baraji et al. .............. 365/158
2013/0070520 A1*  3/2013  El Baraji et al. .............. 365/158

* cited by examiner

*Primary Examiner* — Huan Hoang
(74) *Attorney, Agent, or Firm* — Maryam Imam; IPxLaw Group LLP

(57) ABSTRACT

A method of measuring the resistance of a magnetic tunnel junction (MTJ) is performed by selecting the MTJ to be measured, the MTJ having a resistance associated therewith and coupled to an access transistor. Further, measuring a voltage at an end of the MTJ that is coupled to the access transistor and measuring voltage, V0, at the coupling of the selected MTJ and the associated access transistor, turning off a decoder that is coupled to the MTJ, and after applying current, measuring the applied current and using the measured applied current to determine the resistance of the MTJ.

17 Claims, 2 Drawing Sheets

US 8,830,737 B2

METHOD AND APPARATUS FOR SENSING THE STATE OF A MAGNETIC TUNNEL JUNCTION (MTJ)

BACKGROUND OF THE INVENTION

1. Field of the Invention

This invention relates generally to magnetic tunnel junctions (MTJs) and particularly to measuring the resistance value of the MTJ.

2. Description of the Prior Art

As already known, the resistance of a magnetic tunnel junction (MTJ) is indicative of its magnetic state and therefore can be used to determine the logical state of a memory device using MTJ. Measuring or detecting the resistance of the MTJ is commonly employed in detecting the data that is stored in the MTJ. More specifically, the resistance of the MTJ is notably different when the stored data in the MTJ is one or zero. This is because the MTJ's magnetic layers are parallel relative to one another when the stored data is zero, and the MTJ's magnetic layers are anti-parallel relative to one another when data is one. The MTJ resistance is an effective metric for detecting the stored data. Resistance of a MTJ with relevant magnetic layers having a parallel orientation is commonly of a lower value, $R_{low}$, as opposed to the resistance of the MTJ with relevant magnetic layers having an anti-parallel orientation, which is typically a notably higher resistance, $R_{high}$.

Measuring the resistance of a MTJ provides $R_{low}$, $R_{high}$ and tunnel magneto-resistance (TMR, which is $(R_{high}-R_{low})/R_{low}$). This information can be used for MTJ characterization, evaluation, and for debugging of process problems. Currently, some of this information is collected from test chips, which is limited to a small number of MTJs for measurement. In order to collect a vast amount of data, the actual product, typically a chip made of or including a magnetic random access memory (MRAM) array with a multitude of MTJs can be employed. The MRAM array provides an excellent candidate for measuring $R_{low}$, $R_{high}$. However, currently, there is no reliable structure or manner for using MRAMs to measure $R_{low}$, $R_{high}$.

What is needed is a MRAM having the capability for reliably measuring the MTJ resistances that can be used for MTJ characterization. This would help the MRAM design to increase reliability of the MRAMS particularly during reading/sensing operations.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, a method of sensing a magnetic tunnel junction (MTJ) is performed by selecting the MTJ to be sensed, the MTJ having a resistance associated therewith and coupled to an access transistor. Further, measuring a voltage at an end of the MTJ that is coupled to the access transistor and measuring voltage, V0, at the coupling of the selected MTJ and the associated access transistor, turning off a decoder that is coupled to the MTJ, and after applying a voltage, measuring the applied current and using the measured applied current to determine the resistance of the MTJ.

These and other objects and advantages of the present invention will no doubt become apparent to those skilled in the art after having read the following detailed description of the preferred embodiments illustrated in the several figures of the drawing.

IN THE DRAWINGS

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

In the various embodiments and methods provided herein, a technique for measuring $R_{low}$ and $R_{high}$ from a large MRAM product is disclosed.

Figure 1:
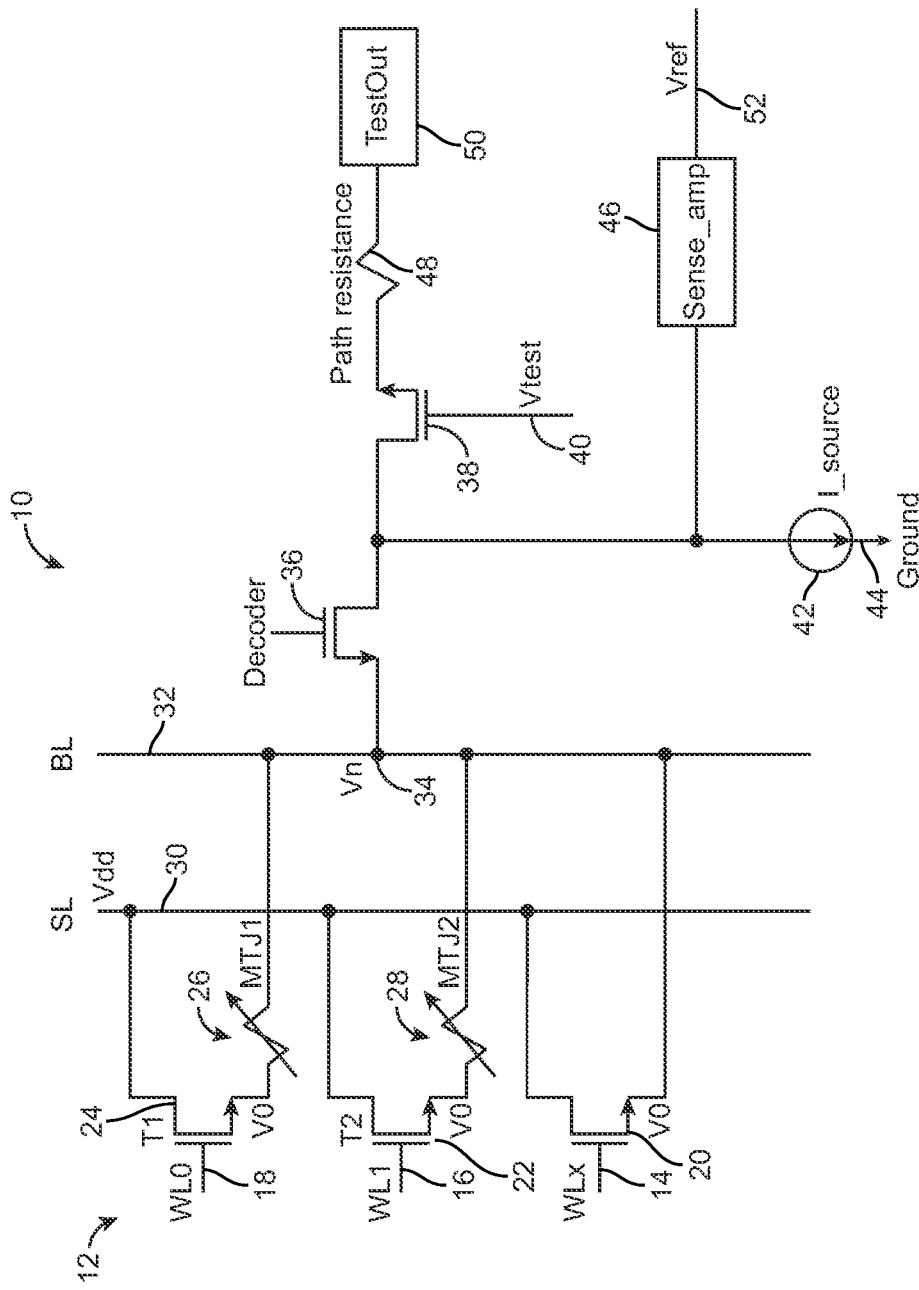
FIG. 1 shows a magnetic tunnel junction (MTJ) sensing circuit 10, in accordance with an embodiment of the invention.

Referring now to FIG. 1, a magnetic tunnel junction (MTJ) sensing circuit 10 is shown, in accordance with an embodiment of the invention. The circuit 10 is shown to include a group of word lines 12, which include the word lines (WLs) 14, 16, and 18, MTJ 26 and MTJ 28, a test transistor 20, the access transistors 22 and 24, a decoding transistor 36, a transistor 38, a path resistance 48, a current source 42, and a sense amplifier 46. It is understood that the circuit 10 may be part of a larger circuit or in a device using a memory array with the array having many MTJs and not just the two shown in FIG. 1. The two MTJs shown in FIG. 1 are merely to demonstrate an example of a method and structure, consistent with the embodiments of the invention, in sensing the states thereof. As is well known in the art, each of the MTJs 26 and 28 has a corresponding access transistor, such as the transistors 24 and 22, respectively.

The transistor 24 is shown to have a gate that is coupled to the word line (WL0) 18. The drain of the transistor 24 is shown coupled to the source line (SL) 30 and the source of the transistor 24 is shown coupled to one end of the MTJ 26 with the other end of the MTJ 26 shown coupled to the bit line (BL) 32. Similarly, the transistor 22 is shown to have a gate that is coupled to the WL1 16. The drain of the transistor 22 is shown coupled to the SL 30 and the source of the transistor 22 is shown coupled to one end of the MTJ 28 with the other end of the MTJ 28 shown coupled to the BL 32. The gate of the test transistor 20 is shown coupled to the WLx 14, its drain is shown coupled to the SL 30 and its source is shown coupled to the BL 32. The voltage at the source of each of the transistors 24, 22, and 20 is shown as "V0". The decoder 36 is a group of transistors, one is shown here symbolically as a transistor 36 with a gate coupled to a signal "decoder" and its source coupled to the BL 32 at a node 34 with a voltage shown by "Vn". The drain of the decoder 36 is shown coupled to the current source 42 at one end of the current source 42 with the other end of the current source 42 shown coupled to ground 44. The drain of the decoder 36 is also shown coupled to the sense amplifier 46, which is shown to receive Vref 52 as its input. The transistor 38 is shown having a gate coupled to the Vtest 40, a drain coupled to the current source 42 and the drain of the transistor 38 and a source coupled to the node Vn 34. The source of the transistor 38 is shown coupled to one end of the resistor 48 and an opposite end of the resistor 48 is shown coupled to testout 50, which is a pad receptive of a signal outside of the circuit 10.

The state of the MTJs 26 and 28 or any other MTJs not shown in FIG. 1 but a part of the circuit 10 are sensed using the remaining circuit shown in FIG. 1. To sense the MTJ 26, SL 30 is coupled to Vdd, or a voltage level that is suitably higher than ground, while the WL0 is maintained at a high voltage or Vdd. The rest of the word lines, such as WL1 and WLx are grounded. A current, I0, is provided by the current source 42 and flows through the MTJ that is being sensed, and generates a voltage on the bit line BL 32. This voltage is compared to the reference voltage Vref 52 by the sense amplifier 46. If the resistance of the MTJ being sensed is high, the voltage at the BL 32 is less than Vref, and the sense amplifier therefore senses a logical state "1" (or "0" as the case may be), and if the resistance of the MTJ being sensed is low, the voltage of the BL 32 is higher than Vref 52 and the sense amplifier 46 senses a voltage of substantially 0 volts (such as the voltage of ground). During this operation, the Vtest 40 is set to a low voltage. To measure the resistance of the MTJ, the voltage of Vtest 40 is raised from low to high. This couples the BL 32 to the testout 50. Since no current flows from the BL 32 to the testout 50 pad, the voltage of the BL 32 can be measured directly on the testout 50 pad. The resistance of the MTJ then is expressed by the following relationship:

$$R = (V0 - Vn)/I0 \quad \text{Eq. (1)}$$

wherein "R" represents the resistance of the MTJ being measured. In Eq. (1), using the circuit 10, Vn is accurately measured, but one needs to measure the V0 and I0 relatively accurately. In order to measure V0, one extra row is provided in the design of the MRAM, with the including the word line 14, WLx. In this row, the transistors, like transistor 20, do not have a MTJ. Since the current through the transistor 20, is the same as transistors 22 and 24, and they are all connected to Vdd, then the voltage across all of them is the same (V0). Therefore by activating word line WLx, the voltage VO can be measured on testout pad. To measure MTJ resistance one also need to measure the current value of the current source I0 in Eq. 1. In order to measure TO, the Decoder voltage on transistor 36 is pulled to ground, disconnecting the current source 42 from Bl. The testout pad is now connected to an arbitrary voltage close to 1-1.2 volt. At this time the current source 42 is pulling current from testout pad, which can easily be measured. Now knowing all values of V0, Vn and current I0, the MTJ resistance can be calculated.

In accordance with the various embodiments of the invention, such as the circuit 10 of FIG. 1, an extra row of transistors that are not coupled to an MTJ, an example of one of the transistors of such a row being the transistor 20, is required so the voltage on the side of the MTJ that is coupled to the decoder 36 can be measured.

The current source 42, at the end opposite to 44 and where it couples to the decoder 36 is coupled to an outside current supply through the testout 50 pad. Accordingly, the embodiment of FIG. 1 advantageously allows measurement of the voltage across the current source 42 accurately by coupling the current source 42 to an outside supply because the outside supply is obviously controllable and measurable. The resistance of every MTJ of the circuit 10 can be measured and tabulated versus the address location of the MTJ and this information can be advantageously used for resistance distribution studies and MTJ anomalies versus their location on the die.

Figure 2:
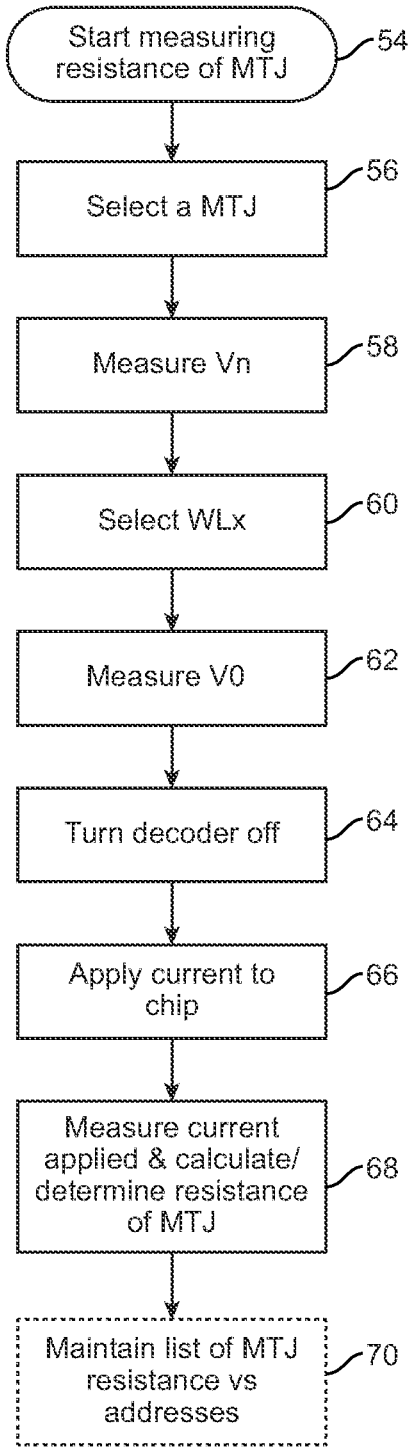
FIG. 2 shows a flow chart of some of the steps performed by the circuit 10 for measuring the resistance of a MTJ, in accordance with a method of the invention.

FIG. 2 shows a flow chart of some of the steps performed by the circuit 10 for measuring the resistance of a MTJ, in accordance with a method of the invention. At 54, the process for measuring begins where the resistance of the MTJ is to be determined. At step 56, the MTJ that is to be read or sensed is selected using the WLs of the circuit 10. Next, at step 58, Vn is measured, followed by selecting or activating WLx 14 at step 60. Next, at step 62, V0, or the voltage at the source of the access transistor that is coupled to the MTJ to be sensed, is measured. Next, at step 64, the decoder 36 of FIG. 1 is turned off and at step 66, current is applied through the pad testout 50. Next, at step 68, the current that is applied to the pad testout 50 is measured and the resistance of the MTJ is determined using the above-noted equations or relationships. Optionally, next, at step 70, a list of MTJ resistances versus addresses is maintained.

It is noted that in an embodiment of the invention, the step 62 above of measuring the voltage, V0, is performed for every bit line for every MTJ in the circuit 10.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of determining a resistance value of a magnetic tunnel junction (MTJ) in a circuit including more than one MTJ comprising:

activating a word line (WL) coupled to a gate of an access transistor, the access transistor being coupled to an end of a MTJ, the MTJ having a resistance associated therewith;

activating a word line, WLx, that is coupled to a gate of a test transistor, the test transistor being coupled to a bit line (BL) and to a 'testout' pad, the BL being coupled to the opposite end of the MTJ;

measuring a voltage, Vn, of the BL through the 'testout' pad;

determining a voltage, V0, at the end of the MTJ by measuring a voltage at the coupling of the test transistor and the BL;

applying a current from an external source, the applied current being controllable externally to the circuit;

measuring the applied current; and using the measured applied current, Vn, and V0, determining the resistance of the MTJ.

2. The method of determining, as recited in claim 1, further including turning off a decoder that is coupled to the MTJ at the opposite end of the MTJ and further coupled to a current source at an opposite end of the decoder, the turning off of the decoder effectively de-coupling the current source from the BL.

3. The method of determining, as recited in claim 1, wherein the measuring of the applied current includes measuring a voltage across a current source, the current source being responsive to current through the 'testout' pad.

4. The method of determining, as recited in claim 1, wherein the test transistor and the access transistor are coupled to a source line (SL).

5. The method of determining, as recited in claim 1, further including determining the resistance of substantially all of the MTJs of the circuit to generate a resistance distribution of the MTJs versus the location of the MTJs on a die onto which the MTJs are formed.

6. The method of claim 1, further including the step of selecting the word line prior to the measuring voltage, V0, step.

7. The method of claim 1, wherein the measuring voltage, V0, step is performed for more than one MTJ.

8. The method of claim 1, further including the step of maintaining a list of determined resistances for the MTJs of the circuit versus addresses of the locations of the MTJs.

9. The method of claim 8, further including using the list of determined resistances for the MTJs of the circuit versus addresses of the locations of the MTJs for resistance distribution or anomalies of the MTJs versus the locations of the MTJs on a die onto which the circuit is formed.

10. The method of claim 1, further including adjusting the external current to accurately measure a voltage across a current source that is coupled to a decoder.

11. A magnetic tunnel junction (MTJ) sensing circuit comprising:
   a plurality of MTJs, each MTJ of the plurality of the MTJs being coupled to a corresponding access transistor at an end of the MTJ, a gate of each corresponding access transistor being coupled to a respective word line (WL), the WL of each of the access transistors configured to select one of the plurality of MTJs, each access transistor being further coupled to a source line (SL), each MTJ of the plurality of the MTJs further coupled to a bit line (BL) at an opposite end;
   a test transistor coupled to a particular word line, WLx,;
   a current source responsive to an external current, the MTJ sensing circuit operable to,
      measure a voltage, Vn, at the opposite end of the MTJ, to be measured;
      measure a voltage, V0, at the end of the MTJ to be measured;
      apply the external current, the external current being controllable externally to the MTJ sensing circuit;
      measure the applied current; and
      using the measured applied current, Vn, and V0, determe the resistance of the MTJ.

12. The MTJ sensing circuit, as recited in claim 11, further including a transistor coupled between a 'testout' pad and the current source.

13. The MTJ sensing circuit, as recited in claim 11, further including a decoder coupled between the BL and a current source, wherein turning off the decoder effectively de-couples the current source from the BL.

14. The magnetic tunnel junction (MTJ) sensing circuit, as recited in claim 11, further including a decoder coupled to the BL and the current source wherein the decoder is turned off before the external current is applied.

15. The magnetic tunnel junction (MTJ) sensing circuit, as recited in claim 11, further including a transistor coupled to the current source and a path resistance coupled to the transistor.

16. The magnetic tunnel junction (MTJ) sensing circuit, as recited in claim 11, further including a row of test transistors.

17. The magnetic tunnel junction (MTJ) sensing circuit, as recited in claim 16, wherein each of the test transistors of the row of test transistors is coupled to at least one MTJ of the plurality of MTJs.

* * * * *